(12) United States Patent
Tessariol et al.

(10) Patent No.: US 9,711,223 B2
(45) Date of Patent: Jul. 18, 2017

(54) APPARATUS AND METHODS INCLUDING A BIPOLAR JUNCTION TRANSISTOR COUPLED TO A STRING OF MEMORY CELLS

(71) Applicant: Micron Technology, Inc., Boise, ID (US)

(72) Inventors: Paolo Tessariol, Montebelluna (IT); Roberto Gastaldi, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/165,072

(22) Filed: Jan. 27, 2014

(65) Prior Publication Data

US 2014/0140134 A1    May 22, 2014

Related U.S. Application Data

(62) Division of application No. 13/115,786, filed on May 25, 2011, now Pat. No. 8,638,605.

(51) Int. Cl.
*G11C 11/34* (2006.01)
*G11C 16/04* (2006.01)
*G11C 16/10* (2006.01)

(52) U.S. Cl.
CPC .......... *G11C 16/0483* (2013.01); *G11C 16/10* (2013.01)

(58) Field of Classification Search
USPC ...................................... 365/185.05, 185.17
See application file for complete search history.

(56) References Cited

U.S. PATENT DOCUMENTS

| 5,163,022 | A | * | 11/1992 | Homma et al. .............. 365/190 |
| 5,371,703 | A | | 12/1994 | Miyamoto |
| 5,483,483 | A | | 1/1996 | Choi et al. |
| 5,590,072 | A | * | 12/1996 | Choi ................. G11C 16/0483 257/E21.69 |
| 5,650,956 | A | | 7/1997 | Choi et al. |
| 6,028,788 | A | * | 2/2000 | Choi ................. G11C 16/0483 365/185.11 |
| 6,888,200 | B2 | | 5/2005 | Bhattacharyya |
| 7,075,140 | B2 | * | 7/2006 | Spadea ............. G11C 16/0416 257/315 |
| 7,483,296 | B2 | | 1/2009 | Bedeschi et al. |
| 7,667,528 | B2 | | 2/2010 | Kim |

(Continued)

FOREIGN PATENT DOCUMENTS

| JP | 5012880 A | 1/1993 |
| KR | 1019980017439 A | 6/1998 |
| WO | WO-2012162494 A3 | 11/2012 |

OTHER PUBLICATIONS

"International Application Serial No. PCT/US2012/039331, International Preliminary Report on Patentability mailed Dec. 5, 2013", 6 pgs.

(Continued)

*Primary Examiner* — Anthan Tran
(74) *Attorney, Agent, or Firm* — Schwegman Lundberg & Woessner, P.A.

(57) ABSTRACT

Some embodiments include apparatus and methods having a string of memory cells, a conductive line and a bipolar junction transistor configured to selectively couple the string of memory cells to the conductive line. Other embodiments including additional apparatus and methods are described.

16 Claims, 9 Drawing Sheets

(56) References Cited

U.S. PATENT DOCUMENTS

| | | |
|---|---|---|
| 8,638,605 B2 | 1/2014 | Tessariol et al. |
| 2008/0144371 A1* | 6/2008 | Yeh et al. ................ 365/185.03 |
| 2009/0285015 A1 | 11/2009 | Ha et al. |
| 2012/0300546 A1 | 11/2012 | Tessariol et al. |

OTHER PUBLICATIONS

"International Application Serial No. PCT/US2012/039331, International Search Report mailed Nov. 30, 2012", 3 pgs.
"International Application Serial No. PCT/US2012/039331, Written Opinion mailed Nov. 30, 2012", 6 pgs.

* cited by examiner

APPARATUS AND METHODS INCLUDING A BIPOLAR JUNCTION TRANSISTOR COUPLED TO A STRING OF MEMORY CELLS

PRIORITY APPLICATION

This application is a divisional of U.S. application Ser. No. 13/115,786, filed May 25, 2011, which is incorporated herein by reference in its entirety.

BACKGROUND

Memory devices, such as flash memory, are widely used in computers and many electronic products. Such memory devices have numerous memory cells. Information can be stored into the memory cells in a programming operation. The stored information can be retrieved in a read operation or can be cleared in an erase operation. As memory cell density increases for a given device area, controlling operations in these devices may pose a challenge.

DETAILED DESCRIPTION

Figure 1:
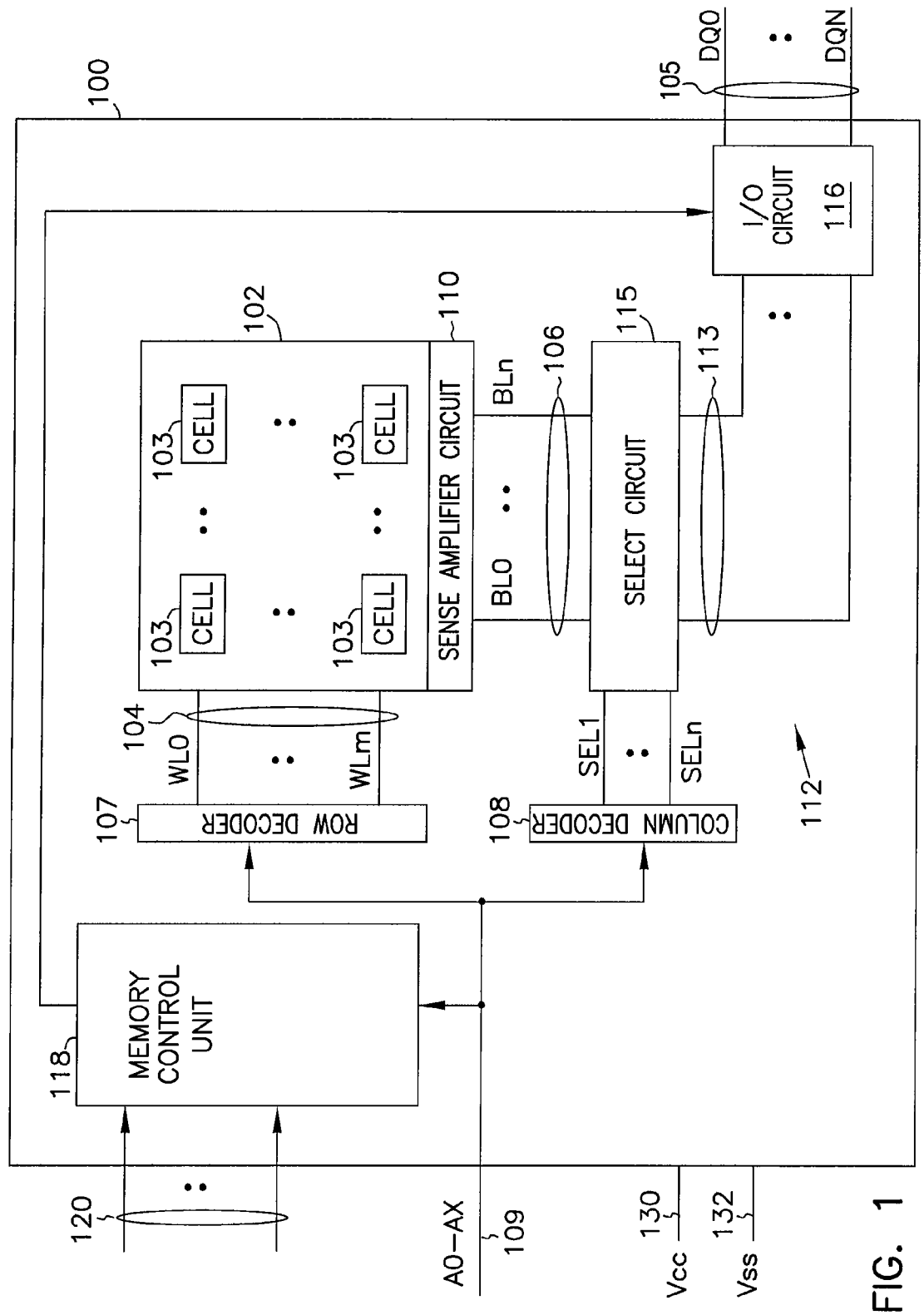
FIG. 1 shows a block diagram of a memory device having a memory array with memory cells, according to an embodiment of the invention.

FIG. 1 shows a block diagram of a memory device 100 having a memory array 102 with memory cells 103, according to an embodiment of the invention. Memory cells 110 can be arranged in rows and columns along with lines 104 and lines 106. Lines 104 can carry signals WL0 through WLm and can form part of access (e.g., word) lines of memory device 100. Lines 106 can carry signals BL0 through BLn and can form part of data lines (e.g., bit lines) of memory device 100.

Memory device 100 may use lines 104 to access memory cells 103 and lines 106 to exchange information (e.g., transfer signals) with memory cells 103. A row decoder 107 and a column decoder 108 decode address signals A0 through AX on lines 109 (e.g., address lines) to determine which memory cells 103 are to be accessed in a memory operation.

Memory device 100 can perform memory operations such as a read operation to read information from memory cells 103 and a write (e.g., programming) operation to write (e.g., program) information into memory cells 103. Memory device 100 can also perform an erase operation to clear information from some or all of memory cells 103.

A memory control unit 118 controls memory operations of memory device 100 based on control signals on lines 120. Examples of the control signals on lines 120 can include one or more clock signals and other signals to indicate which operation (e.g., read, programming, or erase operation) memory device 100 can perform.

Other devices external to memory device 100 (e.g., a memory access device, such as a processor or a memory controller) can control the values of the control signals on lines 120. Specific values of a combination of the signals on lines 120 can produce a command (e.g., read, programming, or erase command) that can cause memory device 100 to perform a corresponding memory operation (e.g., read, programming, or erase operation).

Memory device 100 can include a sense amplifier circuit 110 that operates to determine the value of information sensed (e.g., read) from memory cells 103 in a memory operation, such as a read operation, and provides the information in the form of signals to lines 106. Sense amplifier circuit 110 can also use the signals on lines 106 to determine the value of information to be written (e.g., programmed) into memory cells 103.

Memory device 100 can include circuitry 112 to transfer information between memory array 102 and lines (e.g., data lines) 105. Signals DQ0 through DQN on lines 105 can represent information read from or written into memory cells 103. Lines 105 can include nodes within memory device 100 or pins (or solder balls) on a package where memory device 100 can reside. Other devices external to memory device 100 (e.g., a memory controller or a processor) can communicate with memory device 100 through lines 105, 109, and 120.

Each of memory cells 103 can be programmed to store information representing a value of a fraction of a bit, a value of a single bit or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value representing multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Circuitry 112 of memory device 100 can include a select circuit 115 and an input/output (I/O) circuit 116. Select circuit 115 can respond to signals SEL1 through SELn to select the signals on lines 106 and 113 that can represent the information read from or programmed into memory cells 103. Column decoder 108 can selectively activate the SEL1 through SELn signals based on the A0 through AX address signals on lines 109. Select circuit 115 can select the signals on lines 106 and 113 to provide communication between memory array 102 and I/O circuit 116 during read and programming operations.

Memory device 100 can include a non-volatile memory device and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device.

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the embodiments described herein.

Memory device 100 may include devices and memory cells, and operate using memory operations (e.g., read, programming, and erase operations) similar to or identical to those described below with reference to FIG. 2 through FIG. 11.

Figure 2:
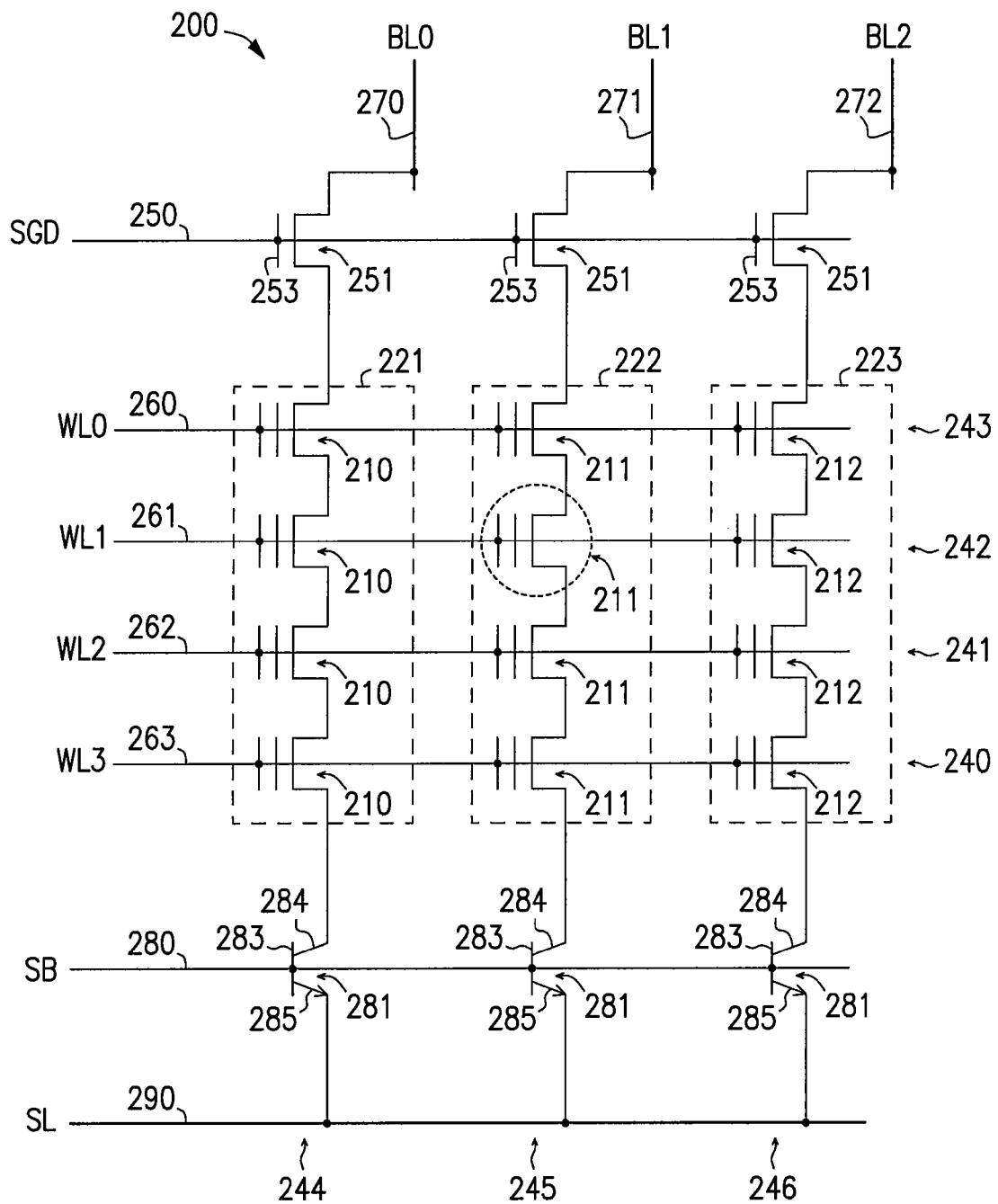
FIG. 2 shows a schematic diagram of a portion of a memory device including memory cells and NPN bipolar junction transistors (BJTs), according to an embodiment of the invention.

FIG. 2 shows a schematic diagram of a portion of a memory device 200 including memory cells 210, 211, and 212 and NPN bipolar junction transistors 281, according to an embodiment of the invention. Memory device 200 can be associated with memory device 100 of FIG. 1, such as forming a portion of memory array 102 of memory device 100. As shown in FIG. 2, memory cells 210, 211, and 212 can be arranged in rows 240, 241, 242, and 243, and columns 244, 245, and 246. Each of memory cells 210, 211, and 212 can include only a single transistor memory cell. FIG. 2 shows an example of four rows and three columns with four memory cells in each column. The number of rows, columns, and memory cells may vary.

Memory cells in the same column can be coupled in series, for example in strings, such as memory cell strings 221, 222, and 223 in columns 244, 245, and 246, respectively. Each of memory cell strings 221, 222, and 223 can include memory cells in the same column. As shown in FIG. 2, memory cell string 221 includes memory cells 210. Memory cell string 222 includes memory cells 211. Memory cell string 223 includes memory cells 212. FIG. 2 shows an example of three memory cell strings with each string having for memory cells. The number of memory cell strings and memory cells in each group may vary.

Memory device 200 can include lines 260, 261, 262, and 263, which can form part of conductive word lines of memory device 200 that can carry signals WL0, WL1, WL2, and WL3, respectively. As shown in FIG. 2, memory cells 210, 211, and 212 in the same row can share the same line 260, 261, 262, or 263. Memory device 200 can use lines 260, 261, 262, and 263 to control access to memory cells 210, 211, and 212 during a read operation to sense (e.g., read) information stored in memory cells 210, 211, and 212, and during a programming operation to store information into memory cells 210, 211, and 212.

Memory device 200 can include lines 270, 271, and 272, which can include conductive lines and can form part of data lines of memory device 200 to carry signals BL0, BL1, and BL2, respectively. Memory device 200 can use lines 270, 271, and 272 to exchange information with memory cells 210, 211, and 212. For example, during a read operation, memory device 200 can use lines 270, 271, and 272 to transfer information sensed from memory cells 210, 211, and 212.

Memory device 200 can include transistors 251 (e.g., select transistors), each being located between one of lines 270, 271, and 272 and memory cells 210, 211, or 212 in a corresponding column. Transistors 251 can include field effect transistors (e.g., metal-oxide semiconductor field effect transistors (MOSFETs)), each having a gate 253. Gate 253 of each of transistors 251 can form part of a line 250 (e.g., control line), which can carry a signal SGD. Line 250 can form part of a control line (e.g., drain select line) of memory device 200. Each of transistors 251 can couple (e.g., when it turns on) a corresponding memory cell string 221, 222, or 223 to an associated line 270, 271, or 272. Each of transistors 251 can decouple (e.g., when it turns off) the corresponding memory cell string 221, 222, or 223 from the associated line 270, 271, or 272. Memory device 200 may use signal SGD on line 250 to turn on or turn off transistors 251. For example, each of transistors 251 may turn on when signal SGD has one value (e.g., voltage value) and turn off when signal SGD has another value (e.g., voltage value).

Each of transistors 281 is located between a line 290 (which can carry a signal SL) and a corresponding memory cell string 221, 222, or 223. Each of transistors 281 can couple (e.g., when it turns on) a corresponding memory cell string 221, 222, or 223 to line 290. Each of transistors 281 can decouple (e.g., when it turns off) the corresponding memory cell string 221, 222, or 223 from line 290. Line 290 includes a conductive line that can be a source line of memory device 200. Line 290 can be coupled to, for example, a ground potential or to a voltage having a positive value. For example, during read and programming operations, line 290 can be coupled to a ground potential. In another example, during an erase operation, line 290 can be coupled to a positive voltage (e.g., a voltage of approximately 20 volts).

As shown in FIG. 2, each of transistors 281 can include an NPN bipolar junction transistor having a base 283, a collector 284, and an emitter 285. Base 283 of each of transistors 281 is coupled to a line 280, which can carry signal SB. Line 280 can form part of another control line (e.g., source select line) of memory device 200. Collector 284 of each of transistors 281 is coupled to memory cells in a corresponding memory cell string 221, 222, or 223. Emitter 285 of each of transistors 281 is coupled to line 290. Each of transistors 281 can operate as a switch that can turn on or turn off based on the value (e.g., voltage value) of signal SB on line 280. For example, transistors 281 may turn on when signal SB has one value (e.g., voltage value) and turn off when signal SB has another value (e.g., voltage value).

FIG. 2 shows an example where memory cell 211 (in the dashed circle) in memory cell string 222 is selected to be accessed during a memory operation, such as a read operation or programming operation. Other memory cells in memory cell string 222 are considered to be unselected memory cells. All memory cells in memory cell strings 221 and 223 are also considered to be unselected memory cells in the example associated with FIG. 2.

In the description herein, a selected memory cell refers to the memory cell that is selected to be accessed in a memory operation (e.g., read, programming, or erase operation), so that memory device 200 can sense information stored in the selected memory cell (e.g., in a read operation) or write information into the selected memory cell (e.g., in a programming operation). An unselected memory cell refers to a memory cell that is not selected to be accessed during a memory operation. A selected memory cell string refers to the string that has a selected memory cell. For example, memory cell string 222 is a selected memory cell string in the example associated with FIG. 2. An unselected memory cell string refers to the string that has all of its memory cells being unselected memory cells. For example, memory cell strings 221 and 223 are unselected memory cell strings in the example associated with FIG. 2.

Table 1 shows example values for signals BL0, BL1, BL2, SGD, WL0, WL1, WL2, WL3, SL, and SB of memory device 200 in FIG. 2 during read, programming, and erase operations.

TABLE 1

| | Read memory cell 211 in string 222 is selected | Programming memory cell 211 in string 222 is selected | Erase strings 221, 222, and 223 are selected strings |
|---|---|---|---|
| BL0 | 0 | V1 (e.g., Vcc) | float |
| BL1 | Vb1 | 0 | float |
| BL2 | 0 | V1 (e.g., Vcc) | float |
| WL0 | Vpass | Vpass | 0 |
| WL1 | Vread | Vpgm | 0 |
| WL2 | Vpass | Vpass | 0 |
| WL3 | Vpass | Vpass | 0 |
| SGD | Vsgd (e.g., Vcc) | Vsgd (e.g., Vcc) | float |
| SL | 0 | 0 | Verase |
| SB | V2 (e.g., V2 > $V_{BEon}$) | 0 (or float) | V3 (e.g., V3 = Verase + $V_{BEon}$) |

In Table 1, voltage Vb1 can have a value of approximately one volt or can have a value approximately equal to the value of the supply voltage (e.g., Vcc) of memory device 200. During an initial time interval (e.g., precharge time interval) of a read operation, line 271 (FIG. 2) can be coupled to voltage Vb1 in order to charge (e.g., precharge) line 271 to a voltage approximately equal to the value of voltage Vb1 (e.g., one volt or alternatively Vcc). Then, during another time interval after the initial time interval when the selected memory (e.g., cell 211 of string 222) is accessed, line 271 can be decoupled from voltage Vb1. In this example, after line 271 is decoupled from voltage Vb1, memory device 200 can sense the signal (e.g., BL1) on line 271 to determine the value of information stored in selected memory cell 211 of string 222.

Voltage Vpass in Table 1 can have a value that can enable unselected memory cells of the selected memory cell string (string 222 in this example) to operate as pass elements to form a conductive path through each of the unselected memory cells. For example, voltage Vpass can have a value of approximately six volts to enable unselected memory cells 211 of string 222 to operate as pass elements.

Voltage Vread can have a value based on the range of the states (e.g., threshold voltage value range) of memory cells 210, 211, and 212. Thus, voltage Vread depends on the state (e.g., threshold voltage value) of the selected memory cell. As an example, voltage Vread can have a value from zero to approximately five volts when the range of the states of memory cells 210, 211, and 212 is between zero (or below zero) and five volts.

Voltage Vpgm can have a value that can enable the state (e.g., threshold voltage value) of the selected memory cell to change in order to reflect the value of information stored in the selected memory cell. For example, voltage Vpgm can have a value of approximately 15 volts to 18 volts.

Voltage Vsgd can have a value that can enable each of transistors 251 associated with a selected memory cell string to turn on in order to couple the selected memory cell string to a corresponding line 270, 271, or 272. For example, voltage Vsgd can have a value approximately equal to the value of the supply voltage of memory device 200 (e.g., Vcc).

Voltage V1 can have a value that can prevent programming of memory cells in unselected memory cell strings (e.g., strings 221 and 223 in the example associated with FIG. 2). For example, voltage V1 can have a value approximately equal to the value of the supply voltage (e.g., Vcc) of memory device 200.

Voltage V2 can have a value that can enable each of transistors 281 associated a selected memory cell string to turn on in order to couple the selected memory cell string to line 290. For example, voltage V2 can have a value greater than the base-emitter junction voltage $V_{BEon}$ of transistors 281. Voltage $V_{BEon}$ can have a value of approximately 0.7 volts or higher, as an example.

Voltage Verase can have a value that can clear information stored in memory cells 210, 211, and 212. For example, voltage Verase can have a value of approximately 20 volts.

Voltage V3 can have a value that can enable each of transistors 281 (FIG. 2) to turn on in an erase operation, such that voltage Verase can be passed from line 290 through transistors 281 to memory cells 210, 211, and 212 of strings 221, 222, and 223 in order to clear information stored in memory cells 210, 211, and 212. For example, if voltage Verase is applied to line 290 during an erase operation to clear information stored in memory cells 210, 211, and 212 in memory cell strings 221, 222, and 223, then voltage V3 (associated with signal SB) applied to line 280 can have a value greater than the value of voltage Verase by an amount of at least equal to the value of voltage $V_{BEon}$ (e.g., V3=Verase+$V_{BEon}$, as shown in Table 1).

In the description herein, "float" refers to a situation where a particular line can be uncoupled to any voltage (e.g., not coupled to ground, to a negative voltage, or to a positive voltage). In such a situation, that particular line can be considered as being in a "float" condition.

Thus, in Table 1, "float" associated with signal BL0, BL1, or BL2 in an erase operation refers to a situation where line 270, 271, or 272 (FIG. 2) associated with signal BL0, BL1, or BL2 can be uncoupled to ground, to a negative voltage, or to a positive voltage in the erase operation. In this situation, line 270, 271, or 272 can be considered as being in a "float" condition.

Figure 3:
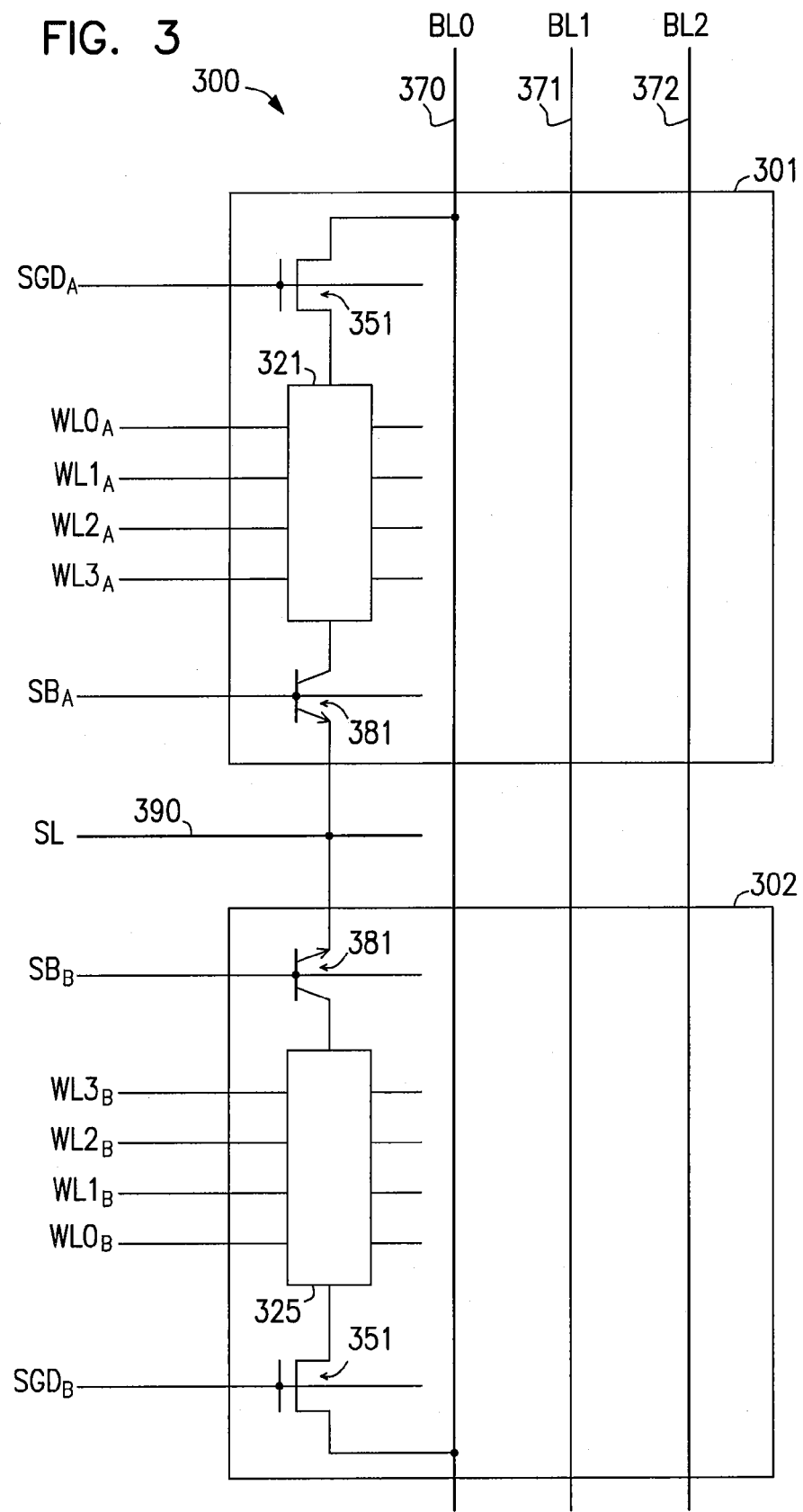
FIG. 3 shows a block diagram of a memory device having groups of memory cells and NPN bipolar junction transistors, according to an embodiment of the invention.

FIG. 3 shows a block diagram of a memory device 300 having groups 301 and 302 of memory cells, according to an embodiment of the invention. Each of groups 301 and 302 can include memory cells and their associated connections to other elements similar to memory cells 210, 211, 212 (FIG. 2) and their associated connections. For simplicity, FIG. 3 omits the memory cells of memory device 300 and their associated connections. Each of groups 301 and 302 can correspond to a block of memory cells of memory device 300. FIG. 3 shows an example of two groups of memory cells in memory device 300. The number of groups may vary.

Memory device 300 can include lines 370, 371, and 372, which can correspond to lines 270, 272, and 273 of FIG. 2. Lines 370, 371, and 372 can carry signals BL0, BL1, and BL2, respectively.

Memory device 300 can include memory cell strings, such as strings 321 and 325. The memory cell strings in each of groups 301 and 302 can be similar to memory cell strings 221, 222, and 223 of FIG. 2. For simplicity, FIG. 3 omits other memory cell strings of memory device 300 and their associated connections to lines 371, 372, and 390.

As shown in FIG. 3, memory cell strings 321 and 325 in groups 301 and 302, respectively, can be coupled to the same line 370 via transistors (e.g., select transistors) 351 and to line 390 via transistors 381. Line 390 can carry signal SL and correspond to line 290 of FIG. 2. Transistors 351 and 381 in FIG. 3 can correspond to transistors 251 and 281, respectively, of FIG. 2.

Signals $SGD_A$, $WL0_A$, $WL1_A$, $WL2_A$, $WL3_A$, $SB_A$, and SL in group 301 can be associated with other elements of memory device 300, such as memory cells and transistors, in a fashion similar to that of signals SGD, WL0, WL1, WL2, WL3, SB, and SL, respectively, of FIG. 2.

Signals $SGD_B$, $WL0_B$, $WL1_B$, $WL2_B$, $WL3_B$, and $SB_B$ in group 302 can be associated with other elements of memory device 300, such as memory cells and transistor, in a fashion similar to that of signals SGD, WL0, WL1, WL2, WL3, and SB, respectively, of FIG. 2.

Memory device 300 can include memory operations, such as read, programming, and erase operations, similar to those of memory device 200 of FIG. 2. The values (e.g., voltage values) of signals shown in FIG. 3 during these memory operations can be similar to or identical to those shown in Table 1 described above.

For example, when at least one memory cell in group 301 is selected during a memory operation, signals BL0, BL1, BL2, $SGD_A$, $WL0_A$, $WL1_A$, $WL2_A$, $WL3_A$, $SB_A$, and SL can have values (e.g., voltage values) corresponding to signals BL0, BL1, BL2, SGD, WL0, WL1, WL2, WL3, SB, and SL, respectively, in Table 1.

In another example, when at least one memory cell in group 302 is selected during a memory operation, signals BL0, BL1, BL2, $SGD_B$, $WL0_B$, $WL1_B$, $WL2_B$, $WL3_B$, $SB_B$, and SL can have values (e.g., voltage values) corresponding to signals BL0, BL1, BL2, SGD, WL0, WL1, WL2, WL3, SB, and SL, respectively, in Table 1.

During a memory operation of memory device 300, one group (e.g., group 301) of memory cells can be a selected group and the other group (e.g., group 302) can be an unselected group.

In the description herein, a selected group of memory cells refers to the group that has at least one selected memory cell during a memory operation. An unselected group of memory cells refers to the group that has no selected memory cells during a memory operation.

For example, in a particular memory operation, group 301 can be a selected group and group 302 can be an unselected group. In another example, in a particular memory operation, group 302 can be a selected group and group 301 can be an unselected group.

Table 2 shows example values for signals BL0, BL1, BL2, $SGD_B$, $WL0_B$, $WL1_B$, $WL2_B$, $WL3_B$, SL, and $SB_B$ associated with group 302 when group 302 is an unselected group (e.g., all memory cells in group 302 are unselected memory cells) during read, programming, and erase operations of memory device 300.

TABLE 2

|  | Read group 302 is unselected | Programming group 302 is unselected | Erase group 302 is unselected |
| --- | --- | --- | --- |
| BL0 | 0 (or 1 volt) | 0 or V1 (e.g., Vcc) | float |
| BL1 | 0 (or 1 volt) | 0 or V1 (e.g., Vcc) | float |
| BL2 | 0 (or 1 volt) | 0 or V1 (e.g., Vcc) | float |
| $WL0_B$ | float | float | Verase |
| $WL1_B$ | float | float | Verase |
| $WL2_B$ | float | float | Verase |
| $WL3_B$ | float | float | Verase |
| $SGD_B$ | 0 | 0 | float |
| SL | 0 | 0 | Verase |
| $SB_B$ | 0 | 0 (or float) | float |

In Table 2, voltages V1 and Verase can have values corresponding to those of Table 1.

Figure 4:
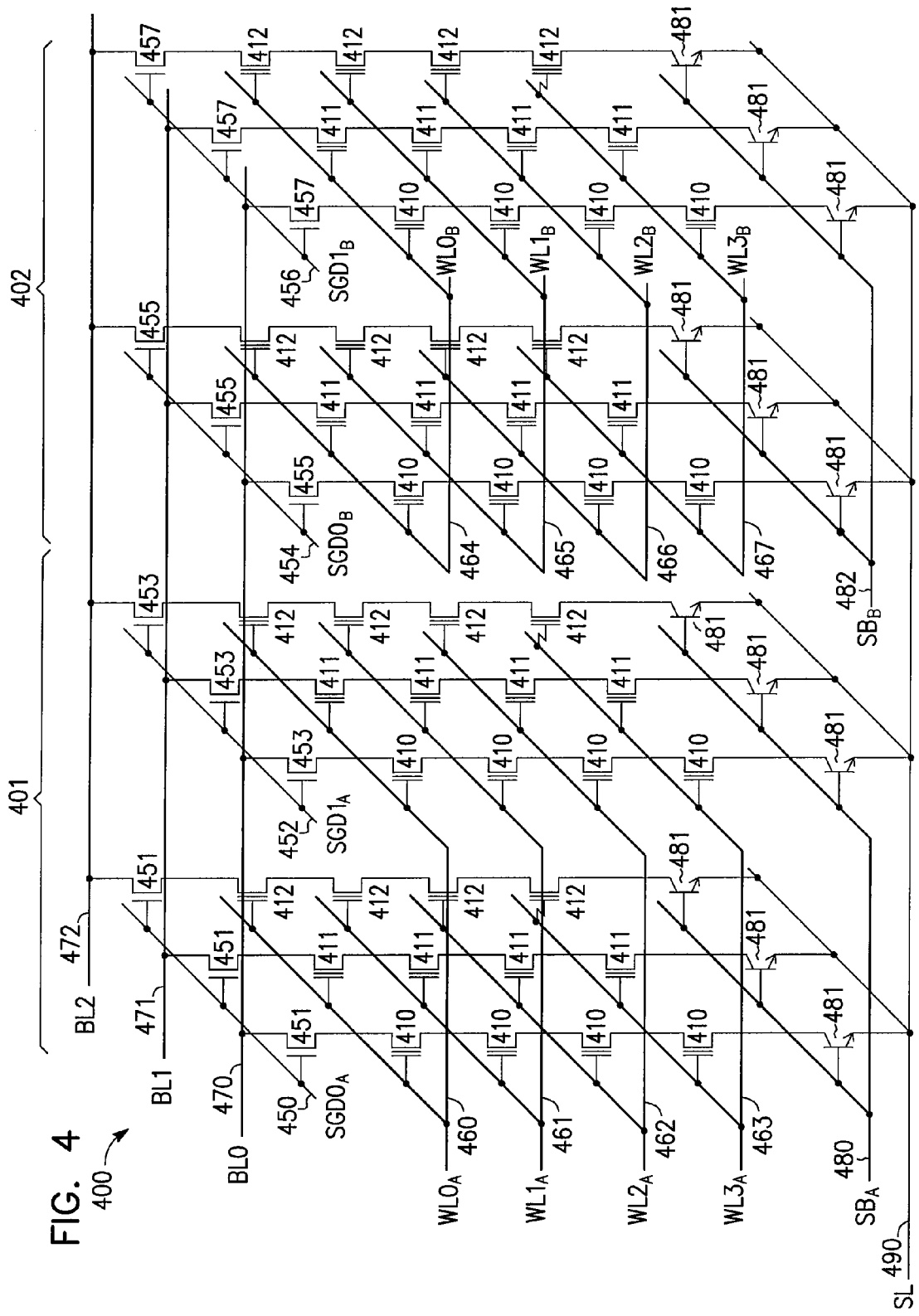
FIG. 4 shows a schematic diagram of a portion of a memory device including stacked memory cells and NPN bipolar junction transistors, according to an embodiment of the invention.

FIG. 4 shows a schematic diagram of a portion of a memory device 400 including stacked memory cells 410, 411, and 412 and NPN bipolar junction transistors 481, according to an embodiment of the invention. Memory device 400 can include lines 470, 471, and 472, which can correspond to lines 270, 271, and 272 of FIG. 2. Lines 470, 471, and 472 can carry signals BL0, BL1, and BL2, respectively.

Memory device 400 can include lines 460 through 467 that can carry corresponding signals $WL0_A$, $WL1_A$, $WL2_A$, $WL3_A$, $WL0_B$, $WL1_B$, $WL2_B$, and $WL3_B$. These signals can correspond to those of FIG. 3.

Memory device 400 can include lines 450, 452, 454, and 456, separated from each other, that can carry signals $SGD0_A$, $SGD1_A$, $SGD0_B$, $SGD1_B$, respectively. Each of signals $SGD0_A$ and $SGD1_A$ can correspond to signal $SGD_A$ of FIG. 3. Each of signals $SGD0_B$ and $SGD1_B$ can correspond to signal $SGD_B$ of FIG. 3.

Memory device 400 can include transistors (e.g., select transistors) 451, 453, 455, and 457. Transistors 451, 453, 455, and 457 can include field effect transistors (e.g., MOSFETs). These transistors can be coupled to lines 450, 452, 454, and 456, respectively, and can be controlled (e.g., turned on or turned off) by corresponding signals $SGD0_A$, $SGD1_A$, $SGD0_B$, $SGD1_B$ on these lines. Each of transistors 451, 453, 455, and 457 can correspond to one of transistors 251 of FIG. 2.

As shown in FIG. 4, each of transistors 451 can have a gate that can form part of line 450. Each of transistors 453 can have a gate that can form part of line 452. Each of transistors 455 can have a gate that can form part of line 454. Each of transistors 457 can have a gate that can form part of line 456. Since lines 450, 452, 454, and 456 are separated from each other, the gates of transistors 451, 453, 455, and 457 associated with these lines can be uncoupled to each other.

Memory device 400 of FIG. 4 can include lines 480 and 482, separated from each other, that can carry signals $SB_A$ and $SB_B$, respectively. Each of lines 480 and 482 can correspond to line 280 of FIG. 2 and lines that carry signals $SB_A$ and $SB_B$ in FIG. 3.

Memory device 400 can include a line 490 that can carry signals SL. Line 490 can correspond to line 290 of FIG. 2 and line 390 of FIG. 3. For example, line 490 can be a source line of memory device 400.

Memory cells 410, 411, and 412 can be physically located in multiple levels of memory device 400, such that some of memory cells 410, 411, and 412 can be stacked over some other memory cells 410, 411, and 412 in multiple levels of memory device 100. As shown in FIG. 4, memory cells 410, 411, and 412 can be arranged in groups (e.g., blocks) such as groups 401 and 402. Each of memory cells 410, 411, and 412 can include only a single transistor memory cell. FIG. 4 shows an example of two groups of memory cells in memory device 400. The number of groups may vary.

Memory cells 410, 411, and 412 can be arranged in memory cell strings. For example, memory cells 410 coupled to line 470 via one of transistors 451 to form one memory cell string. Memory cells 411 coupled to line 471 via one of transistors 451 can form another memory cell string. Memory cells 412 coupled to line 472 via one of transistors 451 can form another memory cell string. Similarly, memory cells 410, 411, and 412 (in group 401) coupled to lines 470, 471, and 472, respectively, via transistors 453 to form three different memory cell strings. Memory cells 410, 411, and 412 (in group 402) coupled to lines 470, 471, and 472, respectively, via transistors 455 and 457 can form six different memory cell strings. FIG. 4 shows an example of 12 memory cell strings in two groups, with each string having four memory cells. The number of memory cell strings and memory cells in each string may vary.

As shown in FIG. 4, each of transistors 481 in group 401 can have a base coupled to the same line 480. Each of transistors 481 in group 402 can have base coupled to the same line 482. Since lines 480 and 482 are separated from each other, the bases of transistors 481 in group 401 are uncoupled to the bases of transistors 481 in group 402.

Each of transistors 481 can operate as a switch that can turn on or turn off based on the values (e.g., voltage values) of signals $SB_A$ and $SB_B$ on lines 480 and 482, respectively. Each of transistors 481 can couple (e.g., when it turns on) a corresponding memory cell string (e.g., memory cells 410, 411, or 412) to line 490. Each of transistors 481 can decouple (e.g., when it turns off) a corresponding memory cell string from line 490.

Memory device 400 can include memory operations (e.g., read, programming, and erase operations) similar to or identical to those of memory device 200 of FIG. 2 and memory device 300 of FIG. 3.

For example, when group 401 is selected in a memory operation and group 402 is unselected, signals BL0, BL1, BL2, $WL0_A$, $WL1_A$, $WL2_A$, $WL3_A$, $SB_A$, and SL associated with group 401 can have values (e.g., voltage values) corresponding to those of signals BL0, BL1, BL2, WL0, WL1, WL2, WL3, SB, and SL, respectively, in Table 1. In this example, if a selected memory cell is included in a memory cell string that is coupled to one of transistors 451, signals $SGD0_A$ associated with group 401 can have values corresponding to those of signal SGD in Table 1 and signal $SGD1_A$ associated with group 401 can have a value of zero. In this example, if the selected memory cell is included in a memory cell string that is coupled to one of transistors 453, signals $SGD1_A$ can have values corresponding to those of signal SGD in Table 1 and signal $SGD0_A$ can have a value of zero. In an erase operation, both signals $SGD0_A$ and $SGD1_A$ can have values corresponding to those of signal SGD in Table 1 (e.g., "float" in an erase operation).

In the above example, group 402 can be an unselected group in the read and programming operations. Thus, in the above example, both of signals $SGD0_B$ and $SGD1_B$ associated with group 402 can have values corresponding to those of signal $SGD_B$ in Table 2. Signals $WL0_B$, $WL1_B$, $WL2_B$, $WL3_B$, $SB_B$, and SL associated with group 402 can have values corresponding to those of signals $WL0_B$, $WL1_B$, $WL2_B$, $WL3_B$, $SB_B$, and SL in Table 2.

Figure 5:
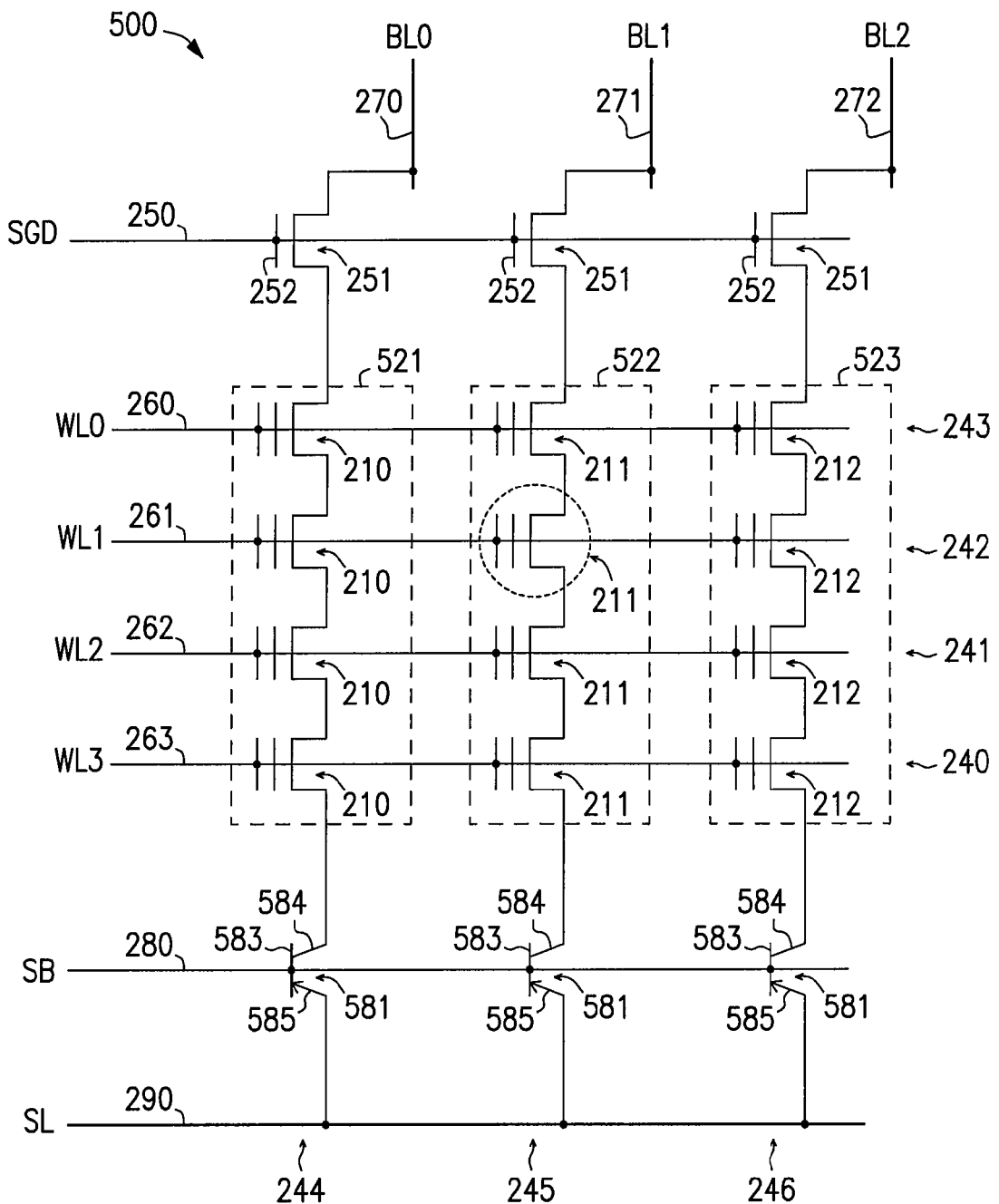
FIG. 5 shows a schematic diagram of a portion of a memory device including memory cells and PNP bipolar junction transistors, according to an embodiment of the invention.

FIG. 5 shows a schematic diagram of a portion of a memory device 500 including memory cells 210, 211, and 212 and PNP bipolar junction transistors 581, according to an embodiment of the invention. Memory device 500 can be associated with memory device 100 of FIG. 1, such as forming a portion of memory array 102 of memory device 100. As shown in FIG. 5, memory device 500 can include similar elements to those of memory device 200 of FIG. 2, except for the transistor types of transistors 581 of FIG. 5. Transistors 581 include PNP bipolar junction transistors. In FIG. 2, transistors 281 include NPN bipolar junction transistors. Memory device 500 can include memory cell strings 521, 522, and 523, which can correspond to memory cell strings 221, 222, and 223, respectively, of FIG. 2. For simplicity, similar elements in FIG. 2 and FIG. 5 are given the same designation labels. The description of the similar elements is also not repeated in the description of FIG. 5.

Each of transistors 581 is located between line 290 and a corresponding memory cell string 521, 522, or 523. Each of transistors 581 can couple (e.g., when it turns on) a corresponding memory cell string 521, 522, or 523 to line 290. Each of transistors 581 can decouple (e.g., when it turns off) the corresponding memory cell string 521, 522, or 523 from line 290.

As shown in FIG. 5, each of transistors 581 can include a PNP bipolar junction transistor having a base 583, a collector 584, and an emitter 585. Base 583 of each of transistors 581 is coupled to a line 280, which can carry signal SB. Collector 584 of each of transistors 581 is coupled to memory cells in a corresponding memory cell string 521, 522, or 523. Emitter 585 of each of transistors 581 is coupled to line 290. Each of transistors 581 can operate as a switch that can turn on or turn off based on the value (e.g., voltage value) of signal SB on line 280. For example, transistors 581 may turn on when signal SB has one value (e.g., voltage value) and turn off when signal SB has another value (e.g., voltage value). Table 3 shows example values for signals BL0, BL1, BL2, SGD, WL0, WL1, WL2, WL3, SL, and SB of memory device 500 in FIG. 5 during read, programming, and erase operations.

TABLE 3

|  | Read memory cell 211 in string 522 is selected | Programming memory cell 211 in string 522 is selected | Erase strings 521, 522, and 523 are selected strings |
|---|---|---|---|
| BL0 | 0 | V1 (e.g., Vcc) | float |
| BL1 | Vbl | 0 | float |
| BL2 | 0 | V1 (e.g., Vcc) | float |
| WL0 | Vpass | Vpass | 0 |

TABLE 3-continued

| | Read memory cell 211 in string 522 is selected | Programming memory cell 211 in string 522 is selected | Erase strings 521, 522, and 523 are selected strings |
|---|---|---|---|
| WL1 | Vread | Vpgm | 0 |
| WL2 | Vpass | Vpass | 0 |
| WL3 | Vpass | Vpass | 0 |
| SGD | Vsgd (e.g., Vcc) | Vsgd (e.g., Vcc) | float |
| SL | 0 | 0 | Verase |
| SB | 0 | float | V4 (e.g., V4 = Verase − $V_{BEon}$) |

In Table 3, voltages, V1, Vb1, Vpass, Vread, Vpgm, Vsgd, and Verase can have values corresponding to those of Table 1.

Voltage V4 in Table 3 can have a value sufficiently to turn on each of transistors 581 (FIG. 5) in an erase operation, such that voltage Verase can be passed from line 290 through transistors 581 to memory cells 210, 211, and 212 of strings 521, 522, and 523 in order to clear information stored in memory cells 210, 211, and 212. For example, if voltage Verase is applied to line 290 during an erase operation to clear information stored in memory cells 210, 211, and 212 in memory cell strings 521, 522, and 523, then voltage V4 (associated with signal SB) applied to line 280 of FIG. 5 can have a value less than the value of voltage Verase by an amount of at least equal to the value of voltage $V_{BEon}$ (e.g., V4=Verase−$V_{BEon}$, as shown in Table 3)

Figure 6:
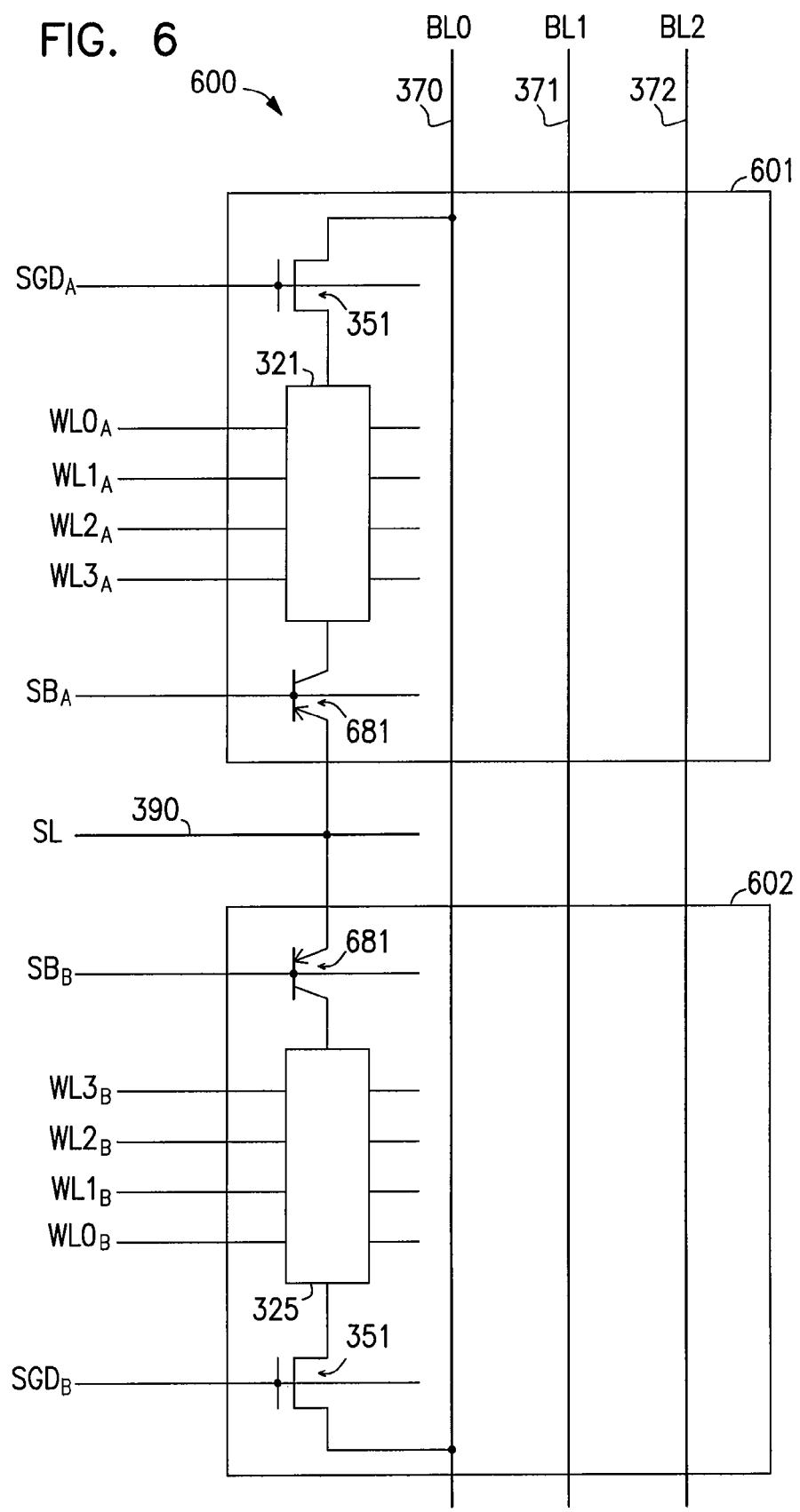
FIG. 6 shows a block diagram of a memory device having groups of memory cells and PNP bipolar junction transistors, according to an embodiment of the invention.

FIG. 6 shows a block diagram of a memory device 600 having groups 601 and 602 of memory cells, according to an embodiment of the invention. Memory device 600 can be the same as memory device 300 (FIG. 3) except for the transistor types of transistors 681 of FIG. 6. Transistors 681 can include PNP bipolar junction transistors. In FIG. 3, transistors 381 can include NPN bipolar junction transistors. For simplicity, similar elements in FIG. 3 and FIG. 6 are given the same designation labels. The description of the similar elements is also not repeated in the description of FIG. 6.

Each of groups 601 and 602 can include memory cells similar to memory cells 210, 211, 212 of FIG. 5 and similar to the memory cells in groups 301 and 302 of FIG. 3. Each of groups 601 and 602 can correspond to a block of memory cells in memory device 600. FIG. 6 shows an example of two groups of memory cells in memory device 600. The number of groups may vary.

Memory device 600 can include memory operations, such as read, programming, and erase operations, similar to those of memory device 500 of FIG. 5. The values (e.g., voltage values) of signals shown in FIG. 6 during these memory operations can be similar to or identical to those shown in Table 3 described above.

For example, when at least one memory cell in group 601 is selected during a memory operation, signals BL0, BL1, BL2, $SGD_A$, $WL0_A$, $WL1_A$, $WL2_A$, $WL3_A$, $SB_A$, and SL can have values corresponding to those of signals BL0, BL1, BL2, SGD, WL0, WL1, WL2, WL3, SB, and SL, respectively, in Table 3.

In another example, when at least one memory cell in group 602 is selected during a memory operation, signals BL0, BL1, BL2, $SGD_B$, $WL0_B$, $WL1_B$, $WL2_B$, $WL3_B$, $SB_B$, and SL can have values corresponding to those of signals BL0, BL1, BL2, SGD, WL0, WL1, WL2, WL3, SB, and SL, respectively, in Table 3.

During a memory operation of memory device 600, one group of memory cells can be a selected group and the other group can be an unselected group. For example, in a particular memory operation, group 601 can be a selected group and group 602 can be an unselected group. In another example, in a particular memory operation, group 602 can be a selected group and group 601 can be an unselected group.

Table 4 shows example values for signals BL0, BL1, BL2, $SGD_B$, $WL0_B$, $WL1_B$, $WL2_B$, $WL3_B$, SL, and $SB_B$ associated with group 602 when group 602 is an unselected group (e.g., all memory cells in group 602 are unselected memory cells) during read, programming, and erase operations of memory device 600.

TABLE 4

| | Read group 602 is unselected | Programming group 602 is unselected | Erase group 602 is unselected |
|---|---|---|---|
| BL0 | 0 (or 1 volt) | 0 or V1 (e.g., Vcc) | float |
| BL1 | 0 (or 1 volt) | 0 or V1 (e.g., Vcc) | float |
| BL2 | 0 (or 1 volt) | 0 or V1 (e.g., Vcc) | float |
| $WL0_B$ | float | float | Verase |
| $WL1_B$ | float | float | Verase |
| $WL2_B$ | float | float | Verase |
| $WL3_B$ | float | float | Verase |
| $SGD_B$ | 0 | 0 | float |
| SL | 0 | 0 | Verase |
| $SB_B$ | 0 | float | float |

In Table 4, voltages V1, Vb1, and Verase can have values corresponding to those of Table 2.

Figure 7:
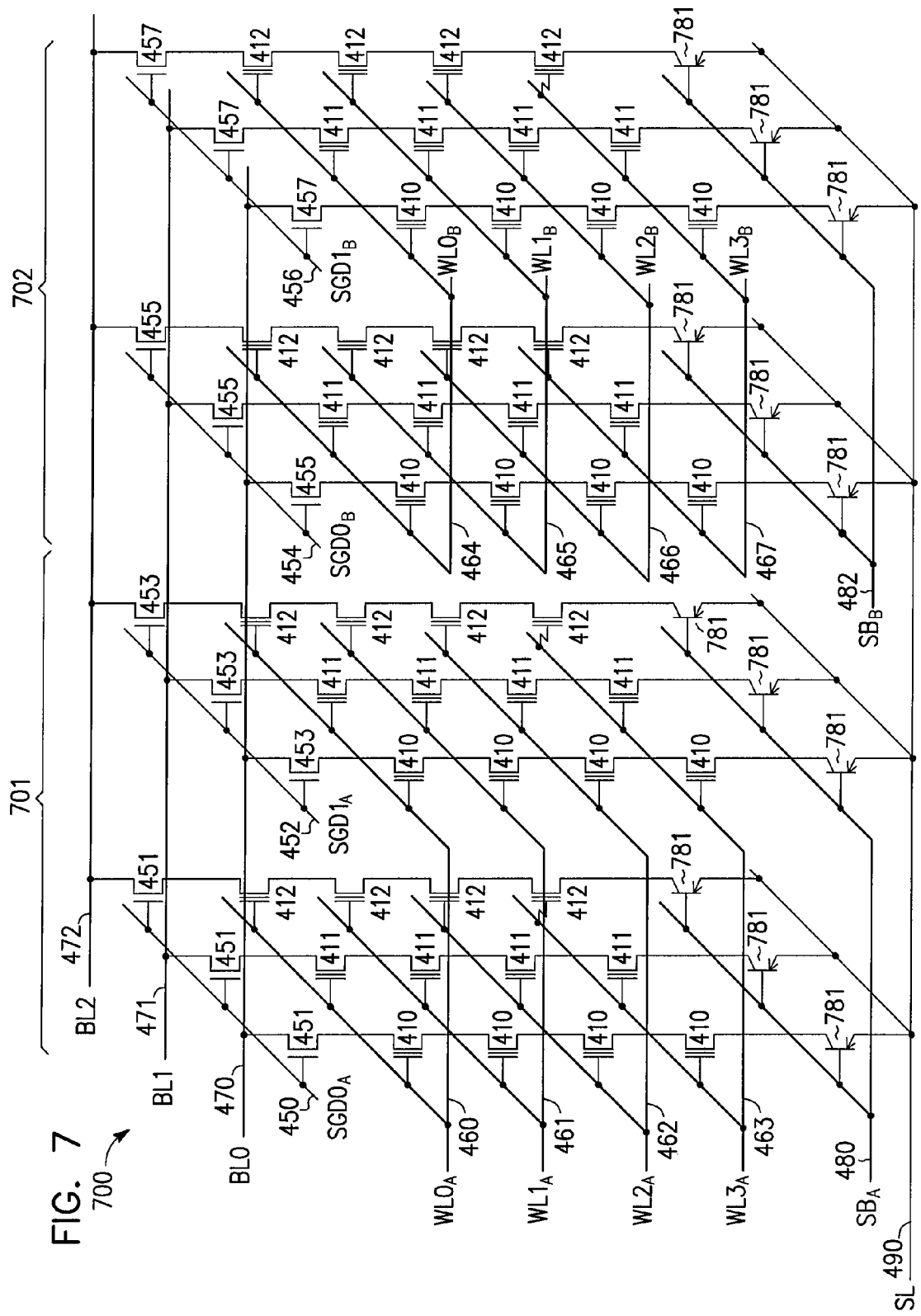
FIG. 7 shows a schematic diagram of a portion of a memory device including stacked memory cells and PNP bipolar junction transistors, according to an embodiment of the invention.

FIG. 7 shows a schematic diagram of a portion of a memory device 700 including stacked memory cells 410, 411, and 412 and PNP bipolar junction transistors 781, according to an embodiment of the invention. As shown in FIG. 7, memory device 700 can include similar elements to those of memory device 400 of FIG. 4, except for the transistor types of transistors 781 of FIG. 7. Transistors 781 include PNP bipolar junction transistors. In FIG. 4, transistors 481 include NPN bipolar junction transistors. For simplicity, similar elements in FIG. 4 and FIG. 7 are given the same designation labels. The description of the similar elements is also not repeated in the description of FIG. 7.

Memory device 700 can include groups 701 and 702 of memory cells 410, 411, and 412. Each of groups 701 and 702 can correspond to a block of memory cells in memory device 700. FIG. 7 shows an example of two groups of memory cells in memory device 700. The number of groups may vary.

As shown in FIG. 4, each of transistors 781 in group 701 can have a base coupled to the same line 480. Each of transistors 781 in group 402 can have a base coupled to the same line 482. Since lines 480 and 482 are separated from each other, the bases of transistors 781 in group 701 are uncoupled to the bases of transistors 781 in group 402.

Each of transistors 781 can operate as a switch that can turn on or turn off based on the values (e.g., voltage values) of signals $SB_A$ and $SB_B$ on lines 480 and 482, respectively. Each of transistors 781 can couple (e.g., when it turns on) a corresponding memory cell string (e.g., memory cells 410, 411, or 412) to line 490. Each of transistors 781 can decouple (e.g., when it turns off) a corresponding memory cell string from line 490.

Memory device 700 can include memory operations (e.g., read, programming, and erase operations) similar to or identical to those of memory device 500 of FIG. 5 and memory device 600 of FIG. 6.

For example, when group 701 is selected in a memory operation and group 702 is unselected, signals BL0, BL1, BL2, WL0$_A$, WL1$_A$, WL2$_A$, WL3$_A$, SB$_A$, and SL associated with group 701 can have values (e.g., voltage values) corresponding to those of signals BL0, BL1, BL2, WL0, WL1, WL2, WL3, SB, and SL, respectively, in Table 3. In this example, if a selected memory cell is included in a memory cell string that is coupled to one of transistors 451, signals SGD0$_A$ associated with group 701 can have values corresponding to those of signal SGD in Table 3, and signal SGD1$_A$ associated with group 701 can have a value of zero. In this example, if the selected memory cell is included in a memory cell string that is coupled to one of transistors 453, signals SGD1$_A$ can have values corresponding to those of signal SGD in Table 3, and signal SGD0$_A$ can have a value of zero. In an erase operation, both signals SGD0$_A$ and SGD1$_A$ can have values corresponding to those of signal SGD in Table 3 (e.g., "float" in an erase operation).

In the above example, group 702 can be an unselected group in the read and programming operations. Thus, in the above example, both signals SGD0$_B$ and SGD1$_B$ associated with group 702 can have values corresponding to those of signal SGD$_B$ in Table 4. Signals WL0$_B$, WL1$_B$, WL2$_B$, WL3$_B$, SB$_B$, and SL associated with group 702 can have values corresponding to those of signals WL0$_B$, WL1$_B$, WL2$_B$, WL3$_B$, SB$_B$, and SL in Table 4.

Figure 8:
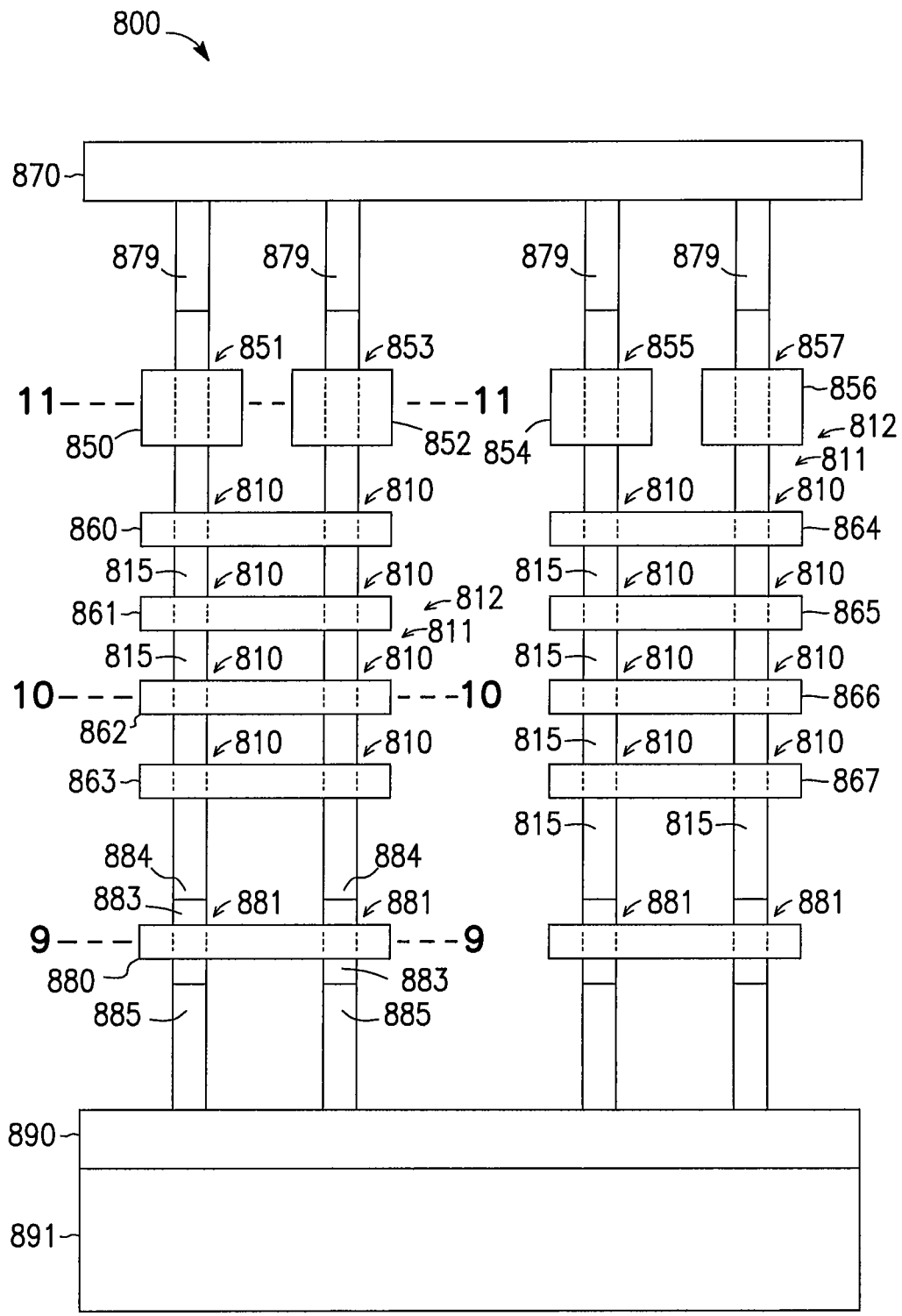
FIG. 8 shows a structure of a portion of a memory device, according to an embodiment of the invention.

FIG. 8 shows a structure of a portion of a memory device 800, according to an embodiment of the invention. Memory device 800 can include a line 890 overlying (e.g., formed on) a substrate 891 or formed in substrate 891. For example, line 890 can be a layer of material formed on substrate 891 after substrate 891 is formed. In another example, line 890 can be a doped region of substrate 891. Line 890 and substrate 891 can have different materials. For example, substrate 891 can include semiconductor material, such as silicon. The silicon material of substrate 891 can be doped silicon (e.g., either n-type or p-type silicon). Line 890 can be a conductive line. Line 890 can include conductive material, such as metal, doped silicon, or other conductive materials, such as those formed on or in substrate 891. For example, line 890 can be an n-doped region over p-doped substrate 891. In another example, line 890 can be a conductive layer (e.g., n-doped polysilicon) over insulator in which the insulator is over silicon substrate 891.

Figure 10:
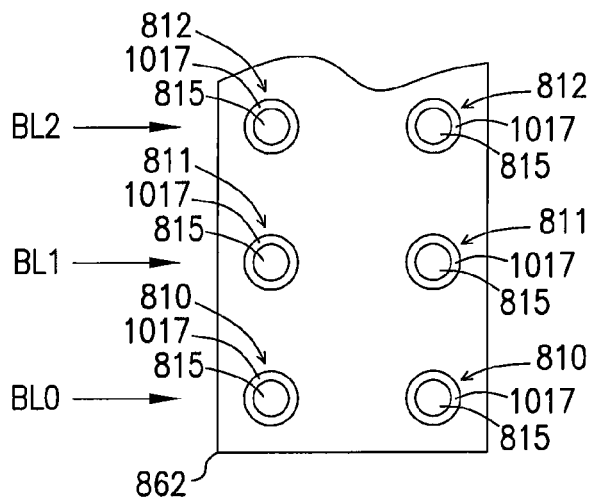
FIG. 10 shows a plane view of a cross section taken along line 10-10 of FIG. 8, according to an embodiment of the invention.

Memory device 800 can include memory cells 810 overlying substrate 891. As shown in FIG. 8, memory cells 810 can be arranged in a stack, such that some of memory cells 810 can be stacked over some other memory cells 810 in different device levels of memory device 800 overlying substrate 891. Memory device 800 can also include memory cells 811 and 812 located behind memory cells 810. Relative locations of memory cells 810, 811 and 812 are shown in FIG. 10. A schematic representation for memory cells 810, 811, and 812 of FIG. 8 can be similar to that of memory cell 410, 411, and 412, respectively, of FIG. 4 and FIG. 7.

Memory device 800 of FIG. 8 can include lines 860, 861, 862, and 863 located along a length of a region 815, and lines 864, 865, 865, and 867 located along a length of another region 815. Lines 860 through 867 can include conductive material, such as metal, doped silicon, or other conductive materials. At least a portion of each of lines 860 through 867 can form a gate (e.g., control gate) associated with one of memory cells 810, 811, and 812. Thus, in FIG. 8, gates associated with lines 860 through 867 can also be located along the length of respective region 815. A schematic representation for lines 860 through 867 can be similar to that of lines 460 through 467, respectively, of FIG. 4 and FIG. 7.

Memory device 800 can include line 870, contacts 879, and lines 850, 852, 854, and 856 associated transistors 851, 853, 855, and 857. Line 870 can form part of data line of memory device 800. Line 870 can include conductive material (e.g., metal or doped silicon). Contacts 879 can include conductive material (e.g., metal or doped silicon). Lines 850, 852, 854, and 856 can include conductive material, such as metal, doped silicon, or other conductive materials. A schematic representation for lines 870, 850, 852, 854, and 856 can be similar to that of lines 470, 450, 452, 454, and 456, respectively, of FIG. 4 and FIG. 7. A schematic representation for transistors 851, 853, 855, and 857 can be similar to that of transistors 451, 453, 455, and 457, respectively, of FIG. 4 and FIG. 7.

Memory device 800 of FIG. 8 can include regions 883, 884, and 885, which can form bipolar junction transistors 881. For example, in each of bipolar junction transistors 881, regions 883, 884, and 885 can form the base, the collector, and the emitter, respectively, of the bipolar junction transistor. Memory device 800 can also include line (e.g., conductive line) 880 coupled to regions 883. Line 880 can correspond to line 280 (FIG. 2 and FIG. 5) and line 480 (FIG. 4 and FIG. 7). Line 880 can include conductive material, such as metal, doped silicon, or other conductive materials.

As shown in FIG. 8, region 884 can be part of region 815. Thus, regions 884 and 815 can include the same material.

Regions 883, 884, and 885 can include semiconductor materials of different conductivity types, such that these regions can operate as a bipolar junction transistor (e.g., operate as an NPN bipolar junction transistor or a PNP bipolar junction transistor). For example, region 883 can include a semiconductor material of one type and both regions 884 and 885 can include a semiconductor material of another type.

As an example, region 883 can include p-type silicon (e.g., polysilicon) material and both regions 884 and 885 can include n-type silicon (e.g., polysilicon) material. In this example, regions 883, 884, and 885 form an NPN bipolar junction transistor. In this example, region 815 can also include n-type silicon material, which is the same material as that of regions 884 and 885.

As another example, region 883 can include n-type silicon material and both regions 884 and 885 can include p-type silicon material. In this example, regions 883, 884, and 885 form a PNP bipolar junction transistor. In this example, region 815 can also include p-type silicon material, which is the same material as that of regions 884 and 885.

The doping concentration of region 885 can be higher than that of region 815. For example, when the silicon material of region 885 and the silicon material of region 815 are doped with the same doping material (e.g., phosphorous) to form n-type silicon material, the concentration of the doping material in region 885 can be higher than the concentration of the doping material in region 815. In another example, when the silicon material of region 885 and the silicon material of region 815 are doped with the same doping material (e.g., boron) to form p-type silicon material, the concentration of the doping material in region 885 can be higher than the concentration of the doping material in region 815.

As shown in FIG. 8, transistors 881 and memory cells 810 can be located in different levels overlying substrate 891 of the same memory device 800. For example, each of transistors 881 can be located between substrate 891 and one of memory cells 810 associated with lines 863, in which one of memory cells 810 associated with lines 863 is located between one of transistors 881 and one of memory cells 810 associated with line 862. Each of memory cells 810 can be located between one of transistors 881 and transistor 851 or between one of transistors 881 and transistor 853.

Memory device 800 can include memory operations (e.g., read, programming, and erase operations) similar to those described above with memory devices 100, 200, 300, 400, 500, 600, and 700. For example, in a memory operation of memory device 800, a voltage can be applied to line 880 to turn on transistors 881. Another voltage can also be applied to line 890 during a memory operation of memory device 800. The values of the voltages on lines 880 and 890 during a memory operation of memory device 800 can correspond to those of signals SL and SB, respectively, in Table 1 and Table 3, or to those of signals SL and $SB_B$, respectively, in Table 2 and Table 4.

Figure 9:
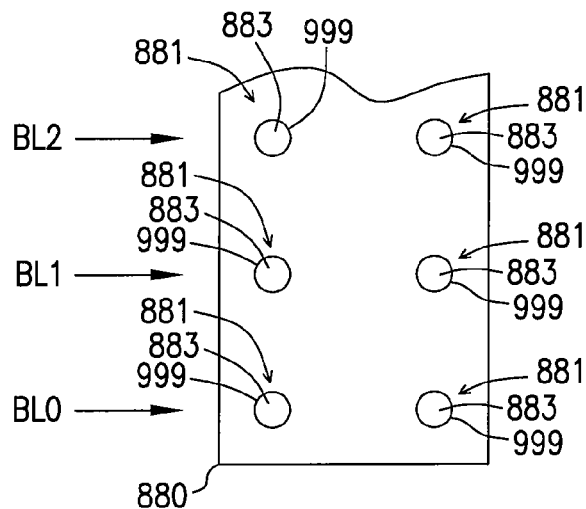
FIG. 9 shows a plane view of a cross section taken along line 9-9 of FIG. 8, according to an embodiment of the invention.

FIG. 9 shows a plane view of a cross section of line 880 and transistors 881 taken along line 9-9 of FIG. 8, according to an embodiment of the invention. FIG. 9 also shows signals BL0, BL1, and BL2 of memory device 800. Signals BL0, BL1, and BL2 in FIG. 9 can correspond to signals BL0, BL1, and BL2 associated with lines 470, 471, and 472 in FIG. 4 and FIG. 7. In FIG. 9, signal BL0 can be associated with line 870 of memory device 800 of FIG. 8. Signals BL1 and BL2 in FIG. 9 can be associated with additional lines (e.g., data lines) of memory device 800 of FIG. 8. Such additional lines are not shown in FIG. 8 but they can correspond to lines 471 (signal BL1) and 472 (signal BL2) in FIG. 4 and FIG. 7.

As shown in FIG. 9, transistors 881 can share the same line 880. Regions 883 and line 880 can be directly coupled to each other (e.g., directly contact each other) at contact locations 999. Since regions 883 and line 880 can be directly coupled to each other, no additional material (e.g., dielectric material) is present at contact locations 999, besides the materials of regions 883 and line 880. Since line 880 can be directly coupled to region 883, a voltage can be applied from line 880 directly to region 883 during a memory operation (e.g., read, programming, or erase operation) of memory device 800.

FIG. 10 shows a plane view of a cross section of line 862 and memory cell 810 taken along line 10-10 of FIG. 8, according to an embodiment of the invention. FIG. 10 also shows signals BL0, BL1, and BL2, which are the same as signals BL0, BL1, and BL2 in FIG. 9. FIG. 10 also shows the relative locations of memory cells 810, 811, and 812 of memory device 800. As shown in FIG. 10, memory cells 810, 811, and 812 can share the same line 862.

Each of memory cells 810, 811, and 812 can include a portion of regions 815 and a structure 1017 between line 862 and a corresponding portion of regions 815. Structure 1017 can include a charge storage structure capable of holding a charge to represent a state (e.g., threshold voltage value) in each of memory cells 810, 811, and 812. For example, structure 1017 can include a combination of a tunnel dielectric layer, a polysilicon layer, and a charge blocking layer; a combination of a nitride layer, an oxide (e.g., oxide of silicon) layer, and a nitride layer; or any other layer or combination of layers that can provide a charge storage function. Thus, structure 1017 can include one or more of dielectric material, polysilicon material, charge blocking material, nitride material, oxide (e.g., oxide of silicon) material, or other materials that can hold a charge in memory cells, such as memory cells 810, 811, and 812.

Figure 11:
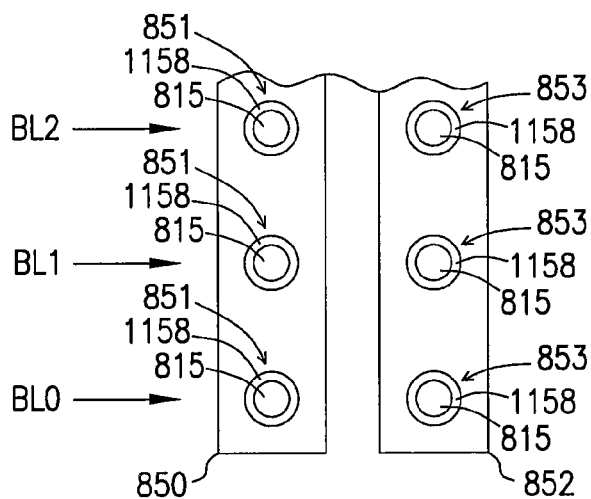
FIG. 11 shows a plane view of a cross section taken along line 11-11 of FIG. 8, according to an embodiment of the invention.

FIG. 11 shows a plane view of a cross section of lines 850 and 852 and transistors 851 and 853 taken along line 11-11 of FIG. 8, according to an embodiment of the invention. FIG. 11 also shows signals BL0, BL1, and BL2, which are the same as signals BL0, BL1, and BL2 in FIG. 9 and FIG. 10. As shown in FIG. 11, each of transistors 851 and 853 can include a portion of regions 815 and a gate dielectric 1158. Gate dielectric 1158 can include a material such as an oxide of silicon or other dielectric material. As shown in FIG. 11, gate dielectric 1158 of each of transistors 851 is between line 850 and a corresponding portion of regions 815. Gate dielectric 1158 of each of transistors 853 is between line 852 and a corresponding portion of regions 815.

The illustrations of apparatus (e.g., memory device 100, 200, 300, 400, 500, 600, 700, and 800) are intended to provide a general understanding of the structure of various embodiments and are not intended to provide a complete description of all the elements and features of apparatus that might make use of the structures described herein.

Any of the components described above with reference to FIG. 1 through FIG. 11 can be implemented in a number of ways, including simulation via software. Thus, apparatus (e.g., memory device 100, 200, 300, 400, 500, 600, 700, and 800) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory device 100, 200, 300, 400, 500, 600, 700, and 800) and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The apparatus of various embodiments may include or be included in electronic circuitry used in high-speed computers, communication and signal processing circuitry, single or multi-processor modules, single or multiple embedded processors, multi-core processors, message information switches, and application-specific modules including multilayer, multi-chip modules. Such apparatus may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 11 include apparatus and methods having a string of memory cells, a conductive line and a bipolar junction transistor configured to selectively couple the string of memory cells to the conductive line. Other embodiments including additional apparatus and methods are described. Such apparatus and methods described herein can improve memory operations (e.g., read, programming, and erase operations) of a memory device, such as memory device 100, 200, 300, 400, 500, 600, 700, and 800.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
applying a first voltage to a first line of a device during a memory operation performed on a first plurality of non-volatile memory cells and a second plurality of non-volatile memory cells of the device, the first plurality of non-volatile memory cells arranged in a first string, the second plurality of non-volatile memory cells arranged in a second string, wherein the first plurality of non-volatile memory cells are coupled to the first line through a base of a first bipolar junction transistor of the device, the second plurality of non-volatile memory cells are coupled to the first line through a base of a second bipolar junction transistor of the device, the first plurality of non-volatile memory cells coupled between the first line and a second line, the second plurality of non-volatile memory cells coupled between the first line and the second line, and wherein the second line includes a data line and the first line includes a source line; and
applying a second voltage to the base of each of the first and second bipolar junction transistors during the memory operation, wherein the memory operation includes an erase operation.

2. A method comprising:
applying a first voltage to a first line of a device during an erase operation performed on a first plurality of non-volatile memory cells and a second plurality of non-volatile memory cells of the device, the first plurality of non-volatile memory cells arranged in a first string, the second plurality of non-volatile memory cells arranged in a second string; and
applying a second voltage to a base of a first bipolar junction transistor coupled between the first line and the first plurality of non-volatile memory cells and to a base of a second bipolar junction transistor coupled between the first line and the second plurality of non-volatile memory cells, the first plurality of non-volatile memory cells coupled to a second line, the second plurality of non-volatile memory cells coupled to the second line, wherein the second line includes a data line and the first line includes a source line, wherein the first voltage includes a first value, and the second voltage includes a second value greater than the first value.

3. The method of claim 2, further comprising:
coupling the first line to a ground potential during a programming operation performed on the first plurality of non-volatile memory cells.

4. The method of claim 3, further comprising:
coupling the base to a ground potential during the programming operation performed on the first plurality of non-volatile memory cells.

5. The method of claim 2, further comprising:
placing the base in a float condition during a programming operation performed on the first plurality of non-volatile memory cells.

6. The method of claim 2, further comprising:
coupling the base to a ground potential during a read operation performed on the first plurality of non-volatile memory cells.

7. A method comprising:
applying a first voltage to a conductive line of a device during an erase operation performed on a plurality of memory cells of the device; and
applying a second voltage to a base of a bipolar junction transistor coupled between the conductive line and the plurality of memory cells, wherein the first voltage includes a first magnitude value, the second voltage includes a second magnitude value, and the first value is greater than the second magnitude value.

8. The method of claim 7, wherein the conductive line includes a source line.

9. A method comprising:
applying a first voltage to a source line of a device during a memory operation performed on a first plurality of memory cells and a second plurality of memory cells of the device, the first plurality of non-volatile memory cells arranged in a first string, the second plurality of non-volatile memory cells arranged in a second string, the first plurality of memory cells coupled between a first select transistor and a first bipolar junction transistor, the first select transistor coupled to a data line, the first bipolar junction transistor coupled to the source line, the second plurality of memory cells coupled between a second select transistor and a second bipolar junction transistor, the second select transistor coupled to the data line, the second bipolar junction transistor coupled to the source line; and
applying a second voltage to a base of each of the first and second bipolar junction transistors during the memory operation.

10. The method of claim 9, wherein the memory operation includes a read operation.

11. The method of claim 9, wherein the memory operation includes a programming operation.

12. The method of claim 9, wherein the first voltage includes a first value, the second voltage includes a second value, and the second value is greater than the first value.

13. The method of claim 9, wherein the first voltage includes a first value, the second voltage includes a second value, and the first value is greater than the second value.

14. The method of claim 9, wherein each of first and second voltages includes a positive value.

15. The method of claim 9, further comprising:
coupling the source line to a ground potential during the memory operation.

16. The method of claim 9, further comprising:
coupling the base line to a ground potential during the memory operation.

* * * * *